United States Patent
Hess et al.

(10) Patent No.: US 7,816,655 B1
(45) Date of Patent: *Oct. 19, 2010

(54) REFLECTIVE ELECTRON PATTERNING DEVICE AND METHOD OF USING SAME

(75) Inventors: Harald F. Hess, La Jolla, CA (US); Marian Mankos, Palo Alto, CA (US); David L. Adler, San Jose, CA (US)

(73) Assignee: KLA-Tencor Technologies Corporation, Milpitas, CA (US)

( * ) Notice: Subject to any disclaimer, the term of this patent is extended or adjusted under 35 U.S.C. 154(b) by 847 days.

This patent is subject to a terminal disclaimer.

(21) Appl. No.: 10/851,041

(22) Filed: May 21, 2004

(51) Int. Cl.
*H01J 37/04* (2006.01)
(52) U.S. Cl. .............. 250/492.2; 250/396 R; 250/492.22; 430/5
(58) Field of Classification Search .............. 250/492.2
See application file for complete search history.

(56) References Cited

U.S. PATENT DOCUMENTS

| | | | |
|---|---|---|---|
| 3,781,827 A * | 12/1973 | Engeler et al. ............. 365/114 |
| 3,882,463 A * | 5/1975 | Britt ......................... 382/217 |
| 4,453,086 A * | 6/1984 | Grobman ................... 250/307 |
| 4,641,359 A * | 2/1987 | Okibayashi et al. ......... 382/324 |
| 4,663,495 A * | 5/1987 | Berman et al. ............. 136/248 |
| 5,254,417 A * | 10/1993 | Wada ......................... 430/5 |
| 5,319,207 A * | 6/1994 | Rose et al. ............. 250/396 R |
| 5,384,463 A * | 1/1995 | Honjo et al. ................ 250/398 |
| 6,177,218 B1 | 1/2001 | Felker et al. |
| 6,207,965 B1 | 3/2001 | Koike |
| 6,235,450 B1 | 5/2001 | Nakasuji |
| 6,291,119 B2 | 9/2001 | Choi et al. |
| 6,333,508 B1 | 12/2001 | Katsap et al. |
| 6,414,313 B1 | 7/2002 | Gordon et al. |
| 6,429,443 B1 | 8/2002 | Mankos et al. |
| 6,461,528 B1 * | 10/2002 | Scherer et al. ............. 216/56 |
| 6,511,048 B1 | 1/2003 | Sohda et al. |
| 6,525,328 B1 | 2/2003 | Miyoshi et al. |
| 6,573,516 B2 | 6/2003 | Kawakami |
| 6,586,733 B1 | 7/2003 | Veneklasen et al. |
| 6,605,811 B2 | 8/2003 | Hotta et al. |
| 6,610,890 B1 | 8/2003 | Garcia de Quesada Fort et al. |
| 6,657,211 B2 | 12/2003 | Benner |
| 6,674,086 B2 | 1/2004 | Kamada |
| 6,730,443 B2 * | 5/2004 | Herr et al. .................. 430/1 |
| 6,768,125 B2 * | 7/2004 | Platzgummer et al. . 250/492.22 |
| 6,882,051 B2 * | 4/2005 | Majumdar et al. .......... 257/746 |
| 7,115,305 B2 * | 10/2006 | Bronikowski et al. .... 427/249.1 |
| 7,432,514 B2 * | 10/2008 | Tromp ................... 250/492.22 |

\* cited by examiner

*Primary Examiner*—David A. Vanore
*Assistant Examiner*—Phillip A. Johnston
(74) *Attorney, Agent, or Firm*—Okamoto & Benedicto LLP

(57) ABSTRACT

One embodiment disclosed relates to a reflective electron patterning device. The device includes a pattern on a surface. There is an electron reflective portion of the pattern and an electron non-reflective portion of the pattern. Another embodiment disclosed relates to a method of reflecting a pattern of electrons. An electron beam is generated to be incident upon a surface. The pattern is formed on the surface. The incident electrons are reflected from a reflective portion of the pattern are prevented from being reflected from a non-reflective portion of the pattern.

38 Claims, 18 Drawing Sheets

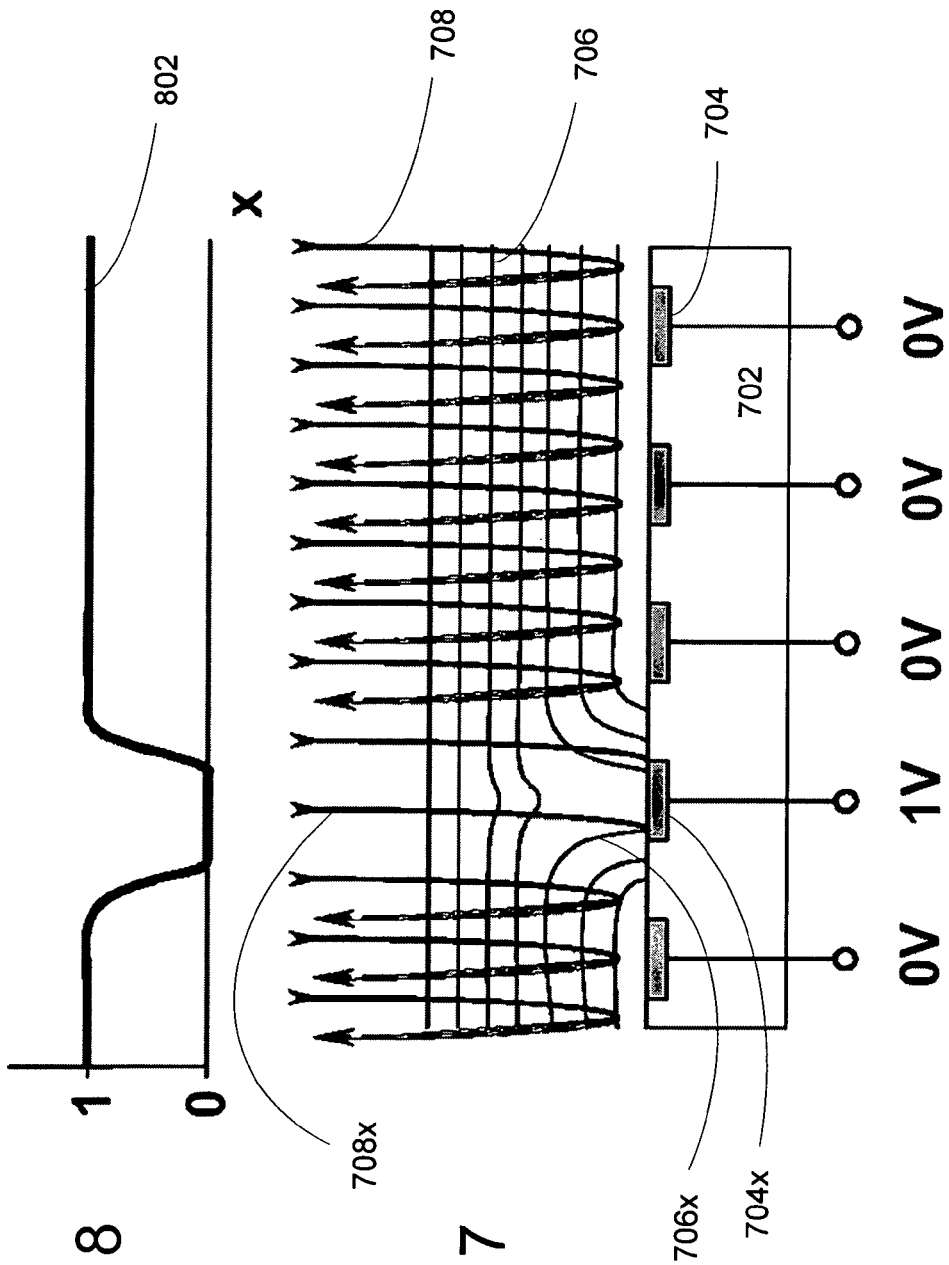

REFLECTIVE ELECTRON PATTERNING DEVICE AND METHOD OF USING SAME

GOVERNMENT LICENSE RIGHTS

The U.S. Government has a paid-up license in this invention and the right in limited circumstances to require the patent owner to license others on reasonable terms as provided for by the terms of Contract No. DAAD19-00-3-1001 awarded by the Defense Advanced Research Projects Agency.

BACKGROUND OF THE INVENTION

1. Field of the Invention

The present invention relates generally to semiconductor manufacturing and related technologies. More particularly, the present invention relates to electron beam lithography.

2. Description of the Background Art

As is well-understood in the art, a lithographic process includes the patterned exposure of a resist so that portions of the resist can be selectively removed to expose underlying areas for selective processing such as by etching, material deposition, implantation and the like. Traditional lithographic processes utilize electromagnetic energy in the form of ultraviolet light for selective exposure of the resist. As an alternative to electromagnetic energy (including x-rays), charged particle beams have been used for high resolution lithographic resist exposure. In particular, electron beams have been used since the low mass of electrons allows relatively accurate control of an electron beam at relatively low power and relatively high speed. Electron beam lithographic systems may be categorized as electron-beam direct write (EBDW) lithography systems and electron beam projection lithography systems.

In EBDW lithography, the substrate is sequentially exposed by means of a focused electron beam, wherein the beam either scans in the form of lines over the whole specimen and the desired structure is written on the object by corresponding blanking of the beam, or, as in a vector scan method, the focused electron beam is guided over the regions to be exposed. The beam spot may be shaped by a diaphragm. EBDW is distinguished by high flexibility, since the circuit geometries are stored in the computer and can be optionally varied. Furthermore, very high resolutions can be attained by electron beam writing, since electron foci with small diameters may be attained with electron-optical imaging systems. However, it is disadvantageous that the process is very time-consuming, due to the sequential, point-wise writing. EBDW is therefore at present mainly used for the production of the masks required in projection lithography.

In electron beam projection lithography, analogously to optical lithography, a larger portion of a mask is illuminated simultaneously and is imaged on a reduced scale on a wafer by means of projection optics. Since a whole field is imaged simultaneously in electron beam projection lithography, the attainable throughputs can be markedly higher in comparison with electron beam writers. Disadvantages of conventional electron beam projection lithography systems includes that a corresponding mask is necessary for each structure to be exposed. The preparation of customer-specific circuits in small numbers is not economic, because of the high costs associated with mask production.

BRIEF DESCRIPTION OF THE DRAWINGS

FIGS. 7 and 8 are diagrams further illustrating the principle of operation of an applied-voltage-based reflective electron patterning device in accordance with an embodiment of the invention.

SUMMARY

Figure 1:
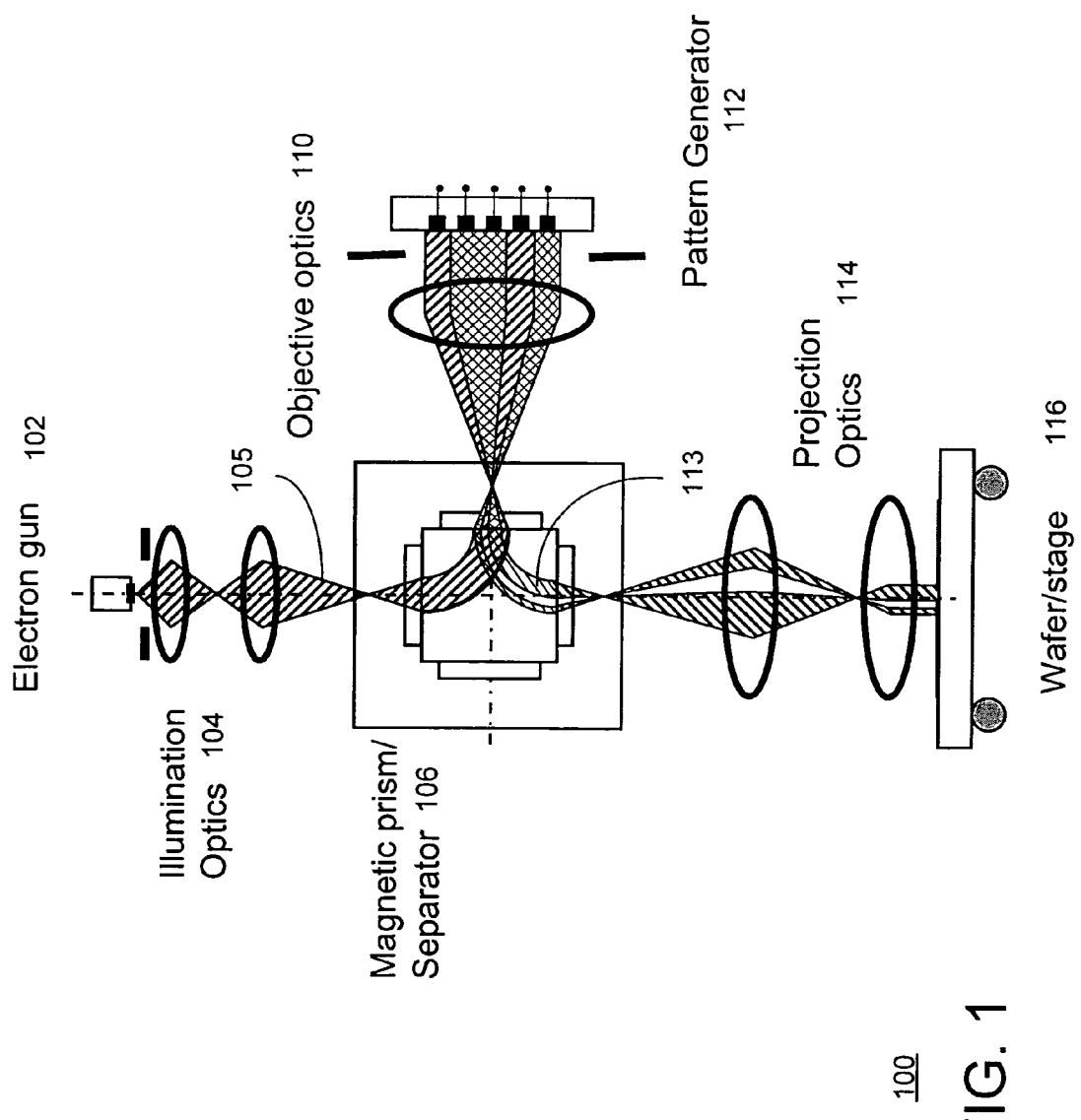
FIG. 1 is a schematic diagram of a reflection electron beam lithography system in accordance with an embodiment of the invention.

One embodiment of the invention pertains to a reflective electron patterning device. The device includes a pattern on a surface. There is an electron reflective portion of the pattern and an electron non-reflective portion of the pattern.

Another embodiment of the invention pertains to a method of reflecting a pattern of electrons. An electron beam is generated to be incident upon a surface. The pattern is formed on the surface. The incident electrons are reflected from a reflective portion of the pattern and are prevented from being reflected from a non-reflective portion of the pattern.

DETAILED DESCRIPTION

As discussed above, electron-beam direct write (EBDW) lithography has the potential to achieve excellent resolution. However, EBDW has a traditional problem relating to its low throughput. For example, it may take ten to one hundred hours to inscribe an entire wafer using EBDW lithography. One previous approach to attempt to increase the throughput is by increasing the beam current. However, when the current density exceeds a certain threshold, electron-electron interactions cause the beam to blur.

This patent application discloses a system and method of electron beam lithography that overcomes the above-discussed disadvantages and problems. Rather than focusing the electron beam into a tiny spot, the approach described herein floods the wafer with the electron beam. This enables use of a high beam current while keeping the beam current density at a level consistent with minimal electron-electron interactions. For example, an area roughly 0.1 millimeters (mm) wide may be illuminated. That area is several orders of magnitude larger than a traditional EBDW system that focuses the beam into a much smaller spot, for example, with a spot size on the order of tens of nanometers (nm) wide.

A flood beam 0.1 mm wide would normally not provide a writing resolution sufficiently high for practical use in integrated circuit manufacturing. However, the system and method disclosed herein enables high-resolution writing by partitioning the flood beam into a multitude (for example, four million) of independently controllable beams.

While others have tried building multiple columns with multiple sources to achieve multiple beams, there are various difficulties in that approach, including the difficulty of making the multiple columns behave uniformly. The system and method disclosed herein may be implemented using a single column and a single source.

A conventional multi-beam system would require a large array of blankers to achieve a multitude of controllable beams from a single column, each blanker being a small and independently controllable element that can be switched on and off rapidly. However, it is quite problematic to build and control such a large array. For example, a blanker array for a conventional multi-beam system is not normally buildable using integrated circuits because such integrated circuits are opaque to electrons.

The system and method disclosed herein re-directs the beam out of the direct line of sight between the electron source and the semiconductor wafer. The beam is re-directed such that it impinges upon a reflective electron patterning device. Various embodiment of such a reflective electron patterning device are discussed and claimed herein.

FIG. 1 is a schematic diagram of a maskless reflection electron beam projection lithography system 100 in accordance with an embodiment of the invention. The name may be abbreviated to a reflection electron beam lithography or REBL system. As depicted, the system 100 includes an electron source 102, illumination electron-optics 104, a magnetic prism 106, an objective electron lens 110, a reflective electron patterning device 112, projection electron-optics 114, and a stage 116 for holding a wafer or other target to be lithographically patterned. In accordance with an embodiment of the invention, the various components of the system 100 may be implemented as follows.

The electron source 102 may be implemented so as to supply a large current at low brightness (current per unit area per solid angle) over a large area. The large current is to achieve a high throughput rate. Preferably, the material of the source 102 will be capable of providing a brightness of about $10^4$ or $10^5$ A/cm$^2$ sr (Amperes per cm$^2$ steradian). One implementation uses LaB$_6$, a conventional electron emitter, which typically have a brightness capability of about $10^6$ A/cm$^2$ sr, as the source material. Another implementation uses tungsten dispenser emitters, which typically have a brightness capability of about $10^5$ A/cm$^2$ sr when operating at 50 kilovolts, as the source material. Other possible emitter implementations include a tungsten Schottky cathode, or heated refractory metal disks (i.e. Ta).

The electron source 102 may be further implemented so as to have a low energy spread. The REBL system 100 should preferably control the energy of the electrons so that their turning points (the distance above the patterning device 112 at which they reflect) are relatively constant, for example, to within about 100 nanometers. To keep the turning points to within about 100 nanometers, the electron source 102 would preferably have an energy spread no greater than 0.5 electron volts (eV). LaB$_6$ emitters have typical energy spreads of 1 to 2 eV, and tungsten dispenser emitters have typical energy spreads of 0.2 to 0.5 eV. In accordance with one embodiment of the invention, the source 102 comprises a LaB$_6$ source or tungsten Schottky emitter that is operated a few hundred degrees C. below its normal operating temperature to reduce the energy spread of the emitted electrons. However, cooler operating temperatures can destabilize the source 102, for example, due to impurities settling on the source surface and thereby diminishing its reliability and stability. Therefore, the source material may be preferably selected to be a material in which impurities are unlikely to migrate to the surface and choke off emission. Moreover, the vacuum on the system may be made stronger to overcome the impurity problem. Conventional lithography systems operate at a vacuum of $10^{-6}$ Torr. A scanning electron microscope (SEM) with a LaB$_6$ source typically operates at $10^{-7}$ Torr. A SEM with a Schottky emitter typically operates at $10^{-6}$ Torr or better in the gun region. In accordance with one implementation, the REBL operates with a gun region vacuum of $10^{-9}$ Torr or lower to protect the stability of the source 102.

The illumination electron-optics 104 is configured to receive and collimate the electron beam from the source 102. The illumination optics 104 allows the setting of the current illuminating the pattern generator structure 112 and therefore determines the electron dose used to expose the substrate. The illumination optics 104 may comprise an arrangement of magnetic and/or electrostatic lenses configured to focus the electrons from the source 102 so as to generate an incident electron beam 105. The specific details of the arrangement of lenses depend on specific parameters of the apparatus and may be determined by one of skill in the pertinent art.

The magnetic prism 106 is configured to receive the incident beam 105 from the illumination optics 104. When the incident beam traverses the magnetic fields of the prism, a force proportional to the magnetic field strengths acts on the electrons in a direction perpendicular to their trajectory (i.e. perpendicular to their velocity vectors). In particular, the trajectory of the incident beam 105 is bent towards the objective lens 110 and the patterning device 112. In a preferred embodiment, the magnetic prism 106 is configured with a non-uniform magnetic field so as to provide stigmatic focusing, for example, as disclosed in U.S. patent application Ser. No. 10/777,646, entitled "Improved Prism Array for Electron Beam Inspection and Defect Review," filed Feb. 10, 2004 by inventor Marian Mankos, the disclosure of which is hereby incorporated by reference in its entirety. A uniform magnetic field provides astigmatic focusing wherein focusing occurs in only one direction (for example, so as to image a point as a line). In contrast, the magnetic prism 106 configuration should focus in both directions (so as to image a point as a point) because the prism 106 is also utilized for imaging. The stigmatic focusing of the prism 106 may be implemented by dividing it into smaller sub-regions with different but uniform magnetic fields. Furthermore, the lens elements in the prism 106 may be of a relatively longer length and width so as to provide for a low distortion image over a large field size. However, increasing the length of the prism 106 involves a trade-off of more electron-electron interactions causing more blur. Hence, the reduced image distortion should be balanced against the increased blur when increasing the prism length.

Below the magnetic prism 106, the electron-optical components of the objective optics are common to the illumination and projection subsystems. The objective optics may be configured to include the objective lens 110 and one or more transfer lenses (not shown). The objective optics receives the incident beam from the prism 106 and decelerates and focuses the incident electrons as they approach the patterning device 112. The objective optics is preferably configured (in cooperation with the gun 102, illumination optics 104, and prism 106) as an immersion cathode lens and is utilized to deliver an effectively uniform current density (i.e. a relatively homogeneous flood beam) over a large area in a plane above the surface of the patterning device 112. In one specific implementation, the objective lens 110 may be implemented to operate with a system operating voltage of 50 kilovolts. Other operating voltages may be used in other implementations.

Various embodiments of the reflective electron patterning device 112 are desclosed herein. Details and advantageous aspects of these embodiments are discussed below in relation to FIGS. 2, 3, 4, 5, 6, 7, 8, 9A, 9B, 10, 11A through 11D, 12, 13, 14 and 15.

The extraction part of the objective lens 110 provides an extraction field in front of the patterning device 112. As the reflected electrons 113 leave the patterning device 112, the objective optics is configured to accelerate the reflected electrons 113 toward their second pass through the prism 106. The prism 106 is configured to receive the reflected electrons 113 from the transfer lens 108 and to bend the trajectories of the reflected electrons towards the projection optics 114.

The projection electron-optics 114 reside between the prism 106 and the wafer stage 116. The projection optics 114 is configured to focus the electron beam and demagnify the beam onto photoresist on a wafer or onto another target. The demagnification may range, for example, from 1× to 20× demagnification (i.e. 1× to 0.05× magnification). The blur and distortion due to the projection optics 114 is preferably a fraction of the pixel size. In one implementation, the pixel size may be, for example, 22.5 nanometers (nm). In such a case, the projection optics 114 preferably has aberrations and distortions of less than 10 nm to 20 nm.

The wafer stage 116 holds the target wafer. In one embodiment, the stage 116 is stationary during the lithographic projection. In another embodiment, the stage 116 is in linear motion during the lithographic projection. In the case where the stage 116 is moving, the pattern on the patterning device 112 may be dynamically adjusted to compensate for the motion such that the projected pattern moves in correspondence with the wafer movement. In other embodiments, the REBL system 100 may be applied to other targets besides semiconductor wafers. For example, the system 100 may be applied to reticles. The reticle manufacturing process is similar to the process by which a single integrated circuit layer is manufactured.

Some embodiments of the reflective electron patterning device 112 comprise a fixed or static pattern, similar to an optical mask. Other embodiments of the reflective electron patterning device 112 comprise a dynamic or programmable pattern.

Figure 2:
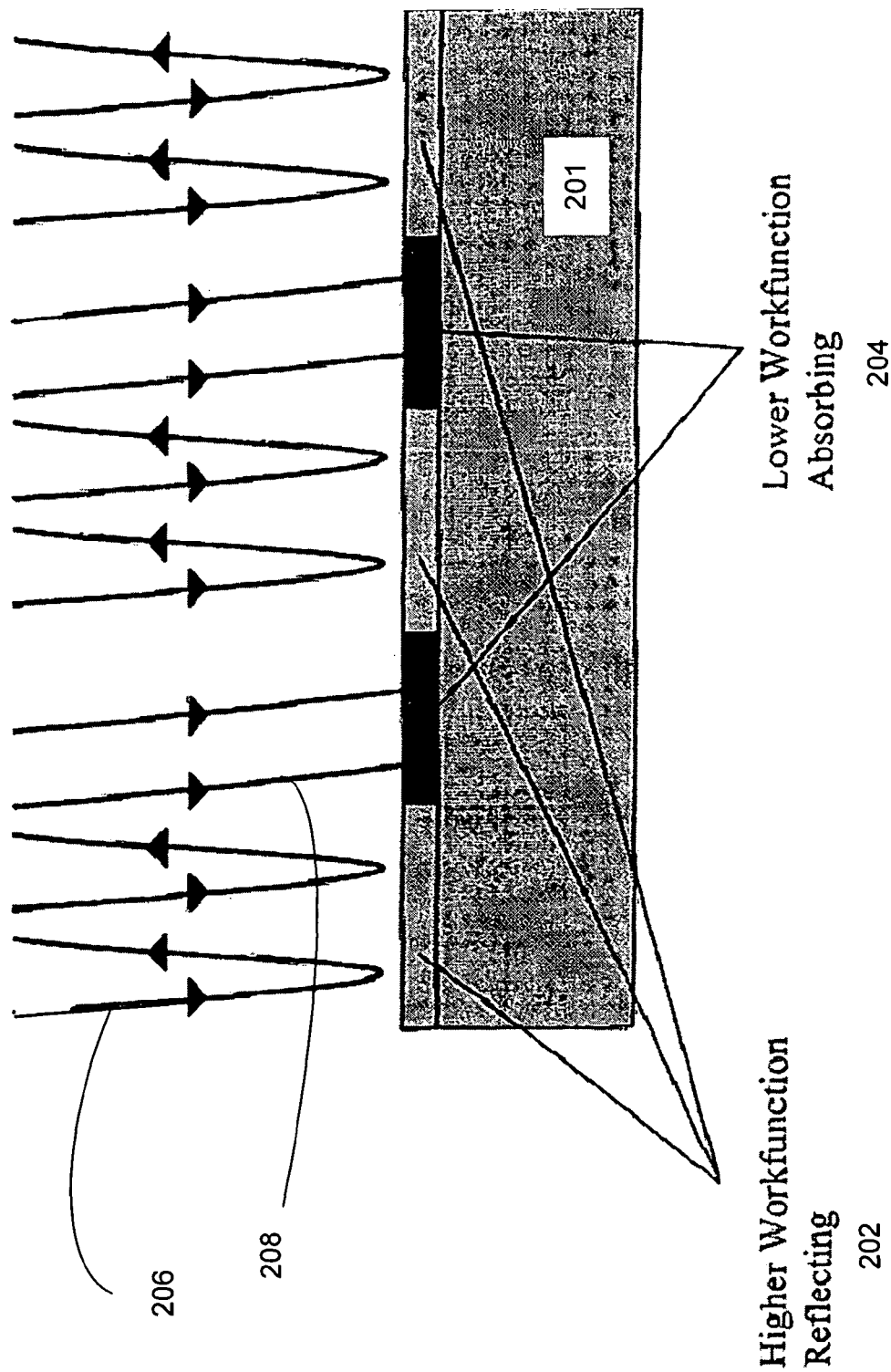
FIG. 2 is a schematic diagram depicting a reflective electron patterning device with workfunction-based differentiation in accordance with an embodiment of the invention.

FIG. 2 is a schematic diagram depicting a reflective electron patterning device with workfunction-based differentiation in accordance with an embodiment of the invention. In this embodiment, the patterning device 112 may be constructed with a substrate 201 having a surface layer thereon. The surface layer may include a higher workfunction material 202 that reflects the incident electrons 206 and a lower workfunction material 204 that absorbs the incident electrons 208. To attain good contrast, the workfunction difference should be more than the energy spread of the illumination electron beam. Given illumination beam energy spreads of less than one electron volt (1 eV), this is achievable with the appropriate selection of materials and surface treatment.

Figure 3:
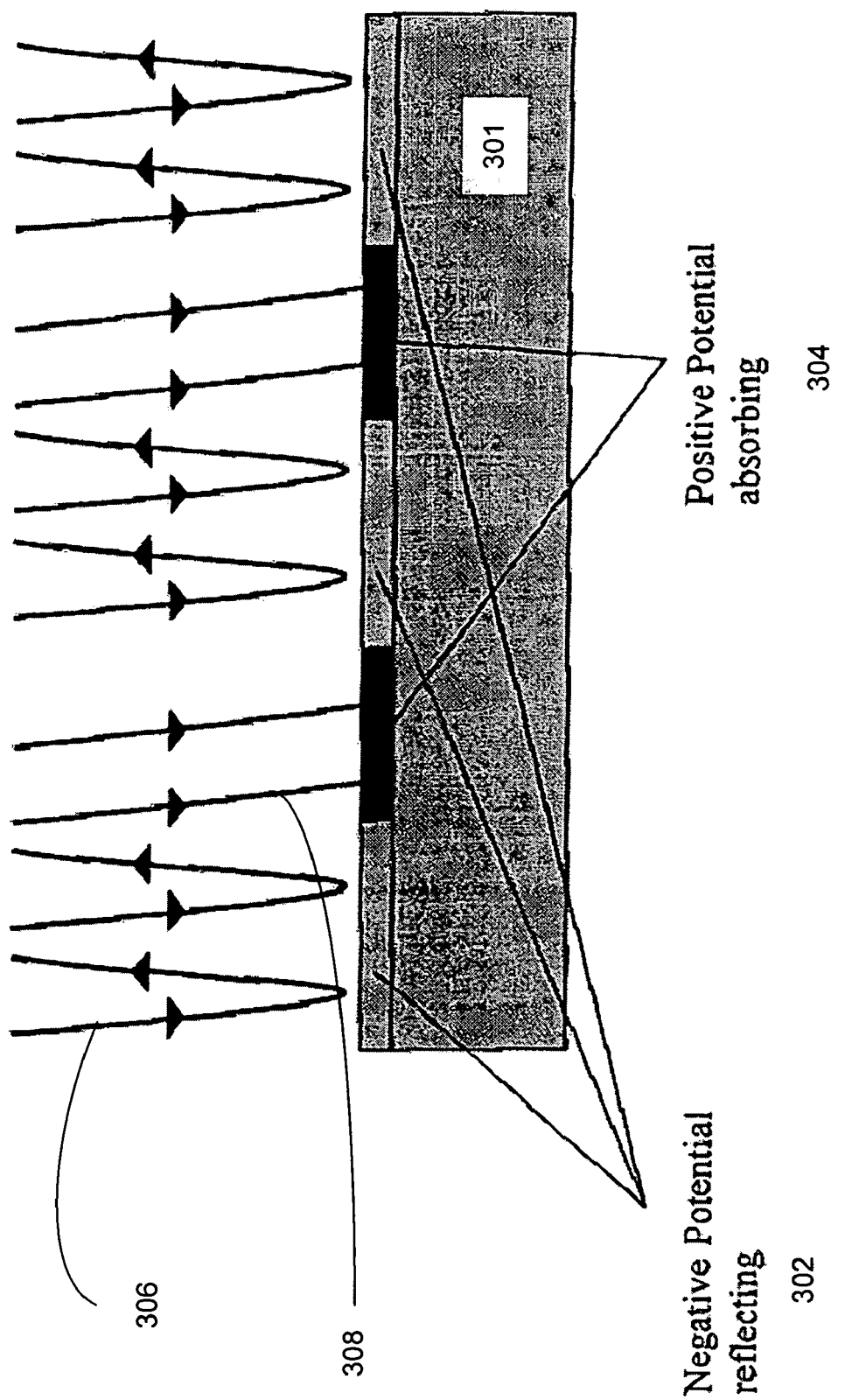
FIG. 3 is a schematic diagram depicting a reflective electron patterning device based on potential-based differentiation in accordance with an embodiment of the invention.

FIG. 3 is a schematic diagram depicting a reflective electron patterning device based on potential-based differentiation in accordance with an embodiment of the invention. In this embodiment, the patterning device 112 may again be constructed with a substrate 301 having a surface layer thereon. The surface layer here includes a relatively negative potential material 302 that reflects the incident electrons 306 and a relatively positive potential material 304 that absorbs the incident electrons 308. For example, a layer with insulating and metallic regions will develop potential energy variations as the surface gets charged from an electron beam. Depending on the electron illumination energy, the sign of the charging can be either positive or negative. Material and thickness may be selected to control and limit the saturation break down voltage.

Figure 4:
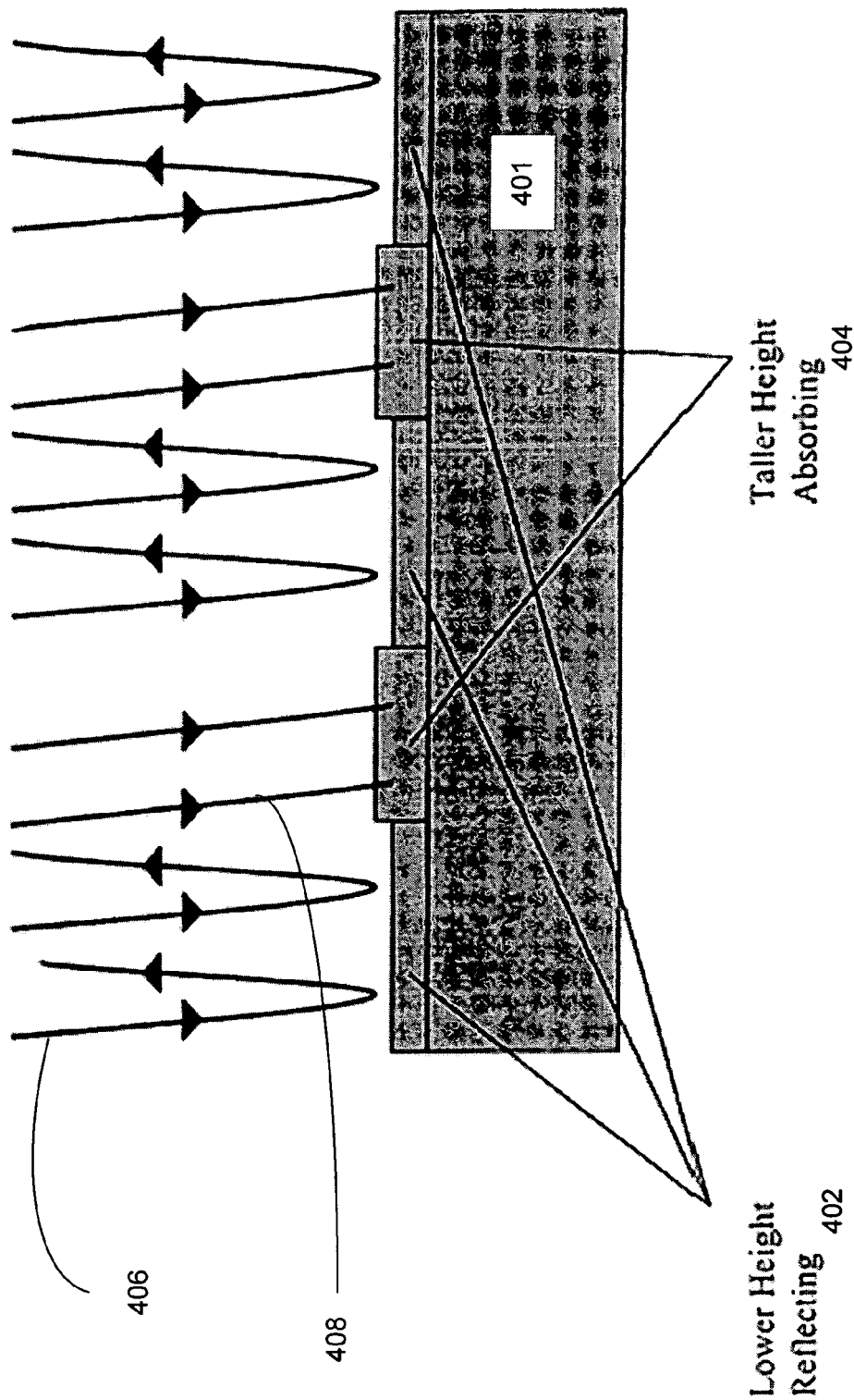
FIG. 4 is a schematic diagram depicting a reflective electron patterning device with a protruding pattern for absorbing a portion of the electrons in accordance with an embodiment of the invention.

FIG. 4 is a schematic diagram depicting a reflective electron patterning device with a protruding pattern for absorbing a portion of the electrons in accordance with an embodiment of the invention. In this embodiment, the patterning device 112 may be constructed with a substrate 401 having a surface layer with topographical variations thereon. The surface layer may include portions with different heights. A relatively lower height portion 402 reflects the incident electrons 406 and a relatively higher height portion 404 absorbs the incident electrons 408. In this embodiment, instead of varying the equipotential contours, the electrostatic contours may remain flat while the topological variations cause the selectivity variations for electrons reflecting from (or absorbing into) the surface. In this case, the protruding patterns may comprise a wide band gap or similar material that prevents free charge accumulation and so allows for the interception and absorption of incident electrons.

Figure 5:
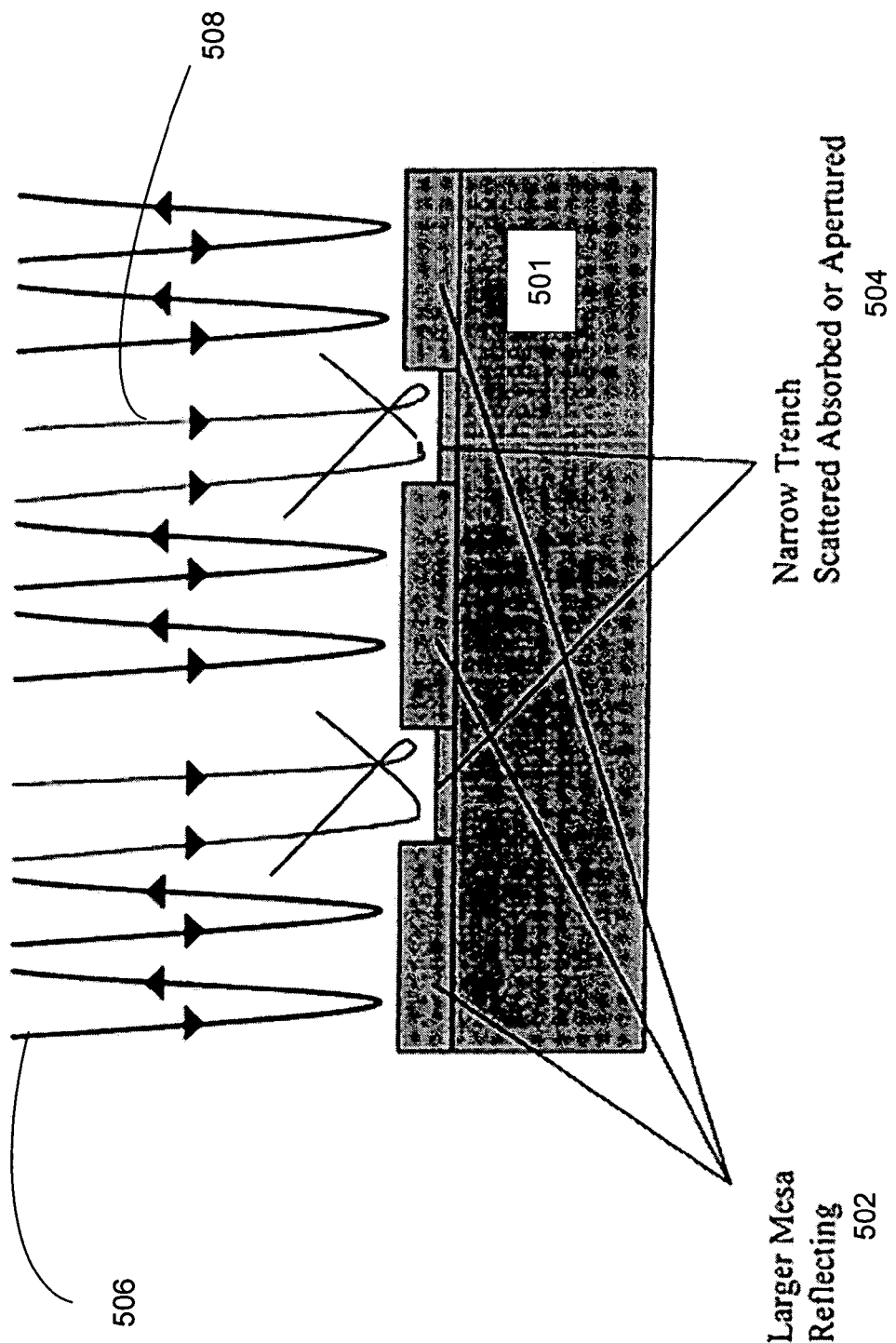
FIG. 5 is a schematic diagram depicting a reflective electron patterning device with a protruding pattern for reflecting a portion of the electrons in accordance with an embodiment of the invention.

FIG. 5 is a schematic diagram depicting a reflective electron patterning device with a protruding pattern for reflecting a portion of the electrons in accordance with an embodiment of the invention. In this embodiment, the patterning device 112 may be constructed with a substrate 501 having a metallic surface layer with a strong relief pattern thereon. Here, a relatively large mesa portion 502 reflects (mirrors) the incident electrons 506 and a relatively narrow trench portion 504 scatters the incident electrons 508.

Figure 6:
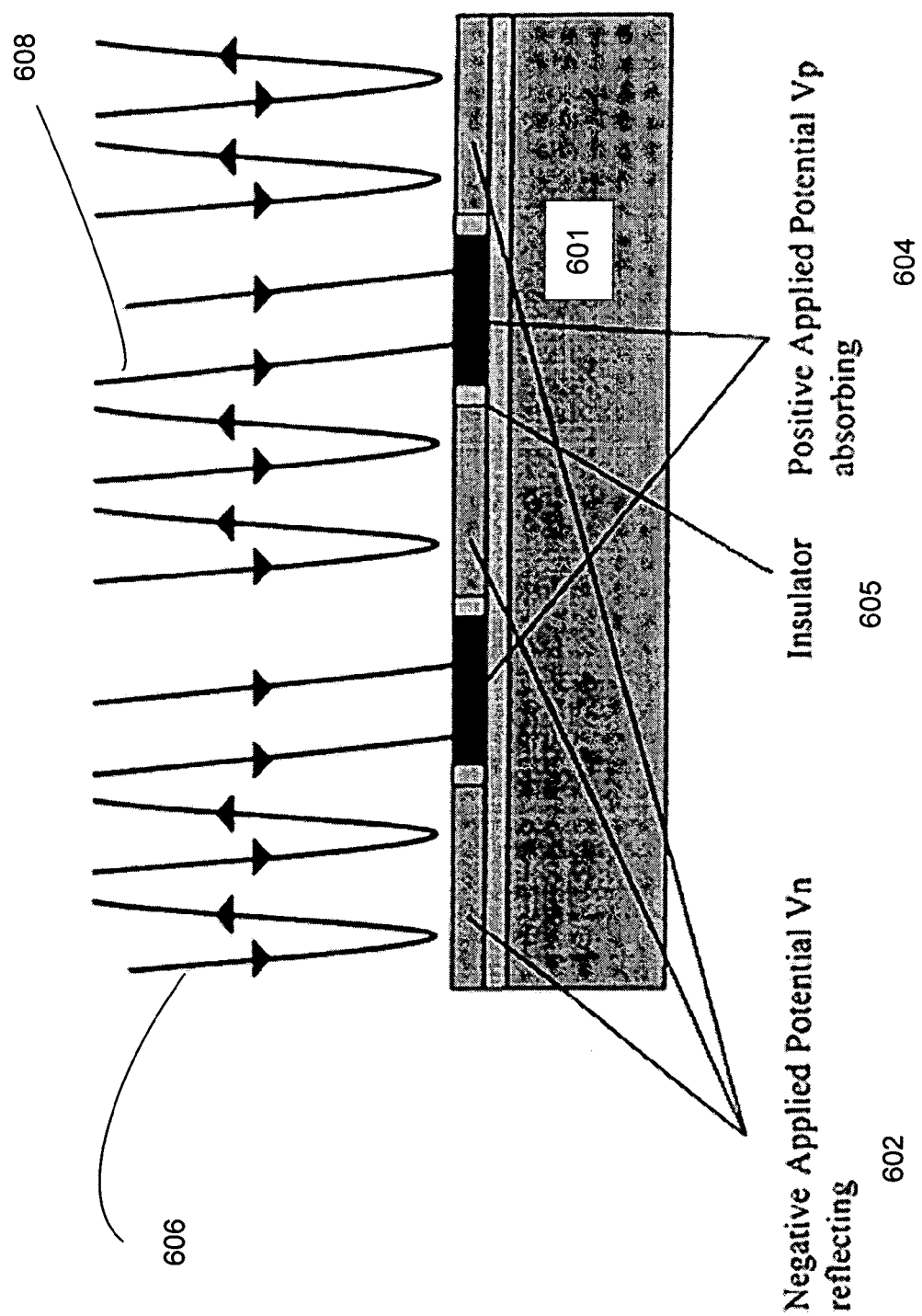
FIG. 6 is a schematic diagram depicting a reflective electron patterning device with applied voltage based differentiation in accordance with an embodiment of the invention.

FIG. 6 is a schematic diagram depicting a reflective electron patterning device with applied voltage based differentiation in accordance with an embodiment of the invention. In this embodiment, the patterning device 112 may be constructed with a substrate 601 having a surface layer with a reflecting portion 602 and an absorbing portion 604, those portions comprising a conductive material and being electrically isolated by way of insulator material 605. A relatively negative voltage is applied to the reflecting portion 602 so that incident electrons 606 are reflected therefrom, and a relatively positive voltage is applied to the absorbing portion 604 so that incident electrons 608 are absorbed thereby. In one embodiment, the reflecting/absorbing portions may comprise independently-controllable pixels in an array of pixels. The applied voltages may be dynamically controlled and varied so as to create what may be called a programmable reflective electron pattern (PREP) or a dynamic pattern generator (DPG). Arbitrary reflective patterns may be formable using a PREP device. The reflective pattern may be digitally programmable to create a reconfigurable reflective "mask" for direct write e-beam lithography.

FIGS. 7 and 8 are diagrams further illustrating the principle of operation of an applied-voltage-based reflective electron patterning device in accordance with an embodiment of the invention. FIG. 7 depicts a cross-section of a substrate 702 showing a column (or row) of pixels. Each pixel includes a conductive area 704. A controlled voltage level is applied to each pixel. In the example illustrated in FIG. 7, four of the pixels are "off" and have zero (0) volts applied thereto, while one pixel (with conductive area labeled 704$x$) is "on" and has one (1) volt applied thereto. (The specific voltages may vary depending on the parameters of the system.) The resultant local electrostatic potential lines 706 are shown, with distortions 706$x$ relating to "off" pixel shown. In this example, the incident electrons 708 approaching the patterning device 112 come to a halt in front of and are reflected by each of the "on" pixels, but the incident electrons 708$x$ are drawn into and absorbed by the "off" pixel. The resultant reflected current (in arbitrary units) is shown in FIG. 8. As seen from FIG. 8, the reflected current is "0" for the "off" pixel and "1" for the "on" pixels.

Figure 9A:
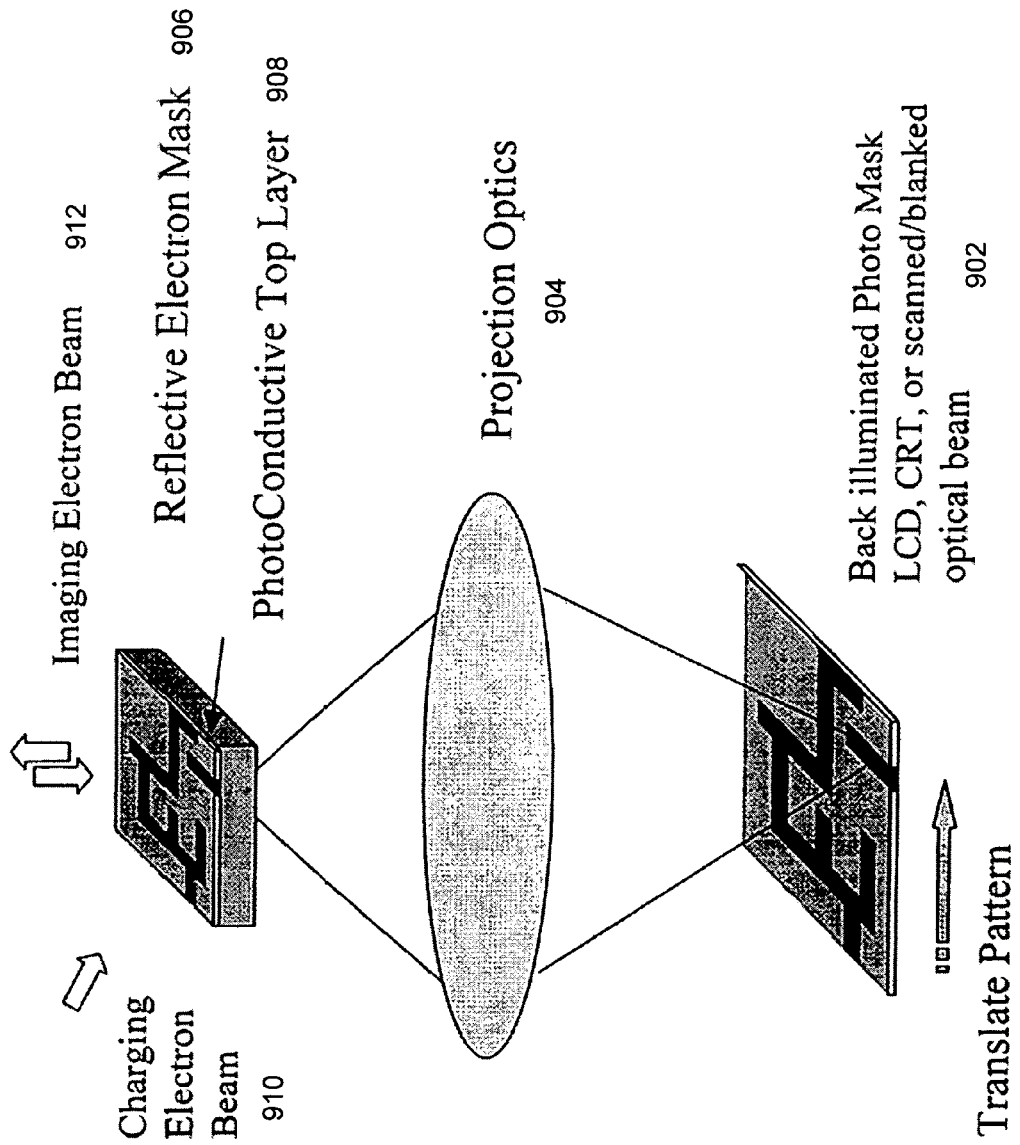
FIG. 9A is a schematic diagram depicting a system configured to transfer an optical pattern to a reflective electron mask having a photoconductive layer in accordance with an embodiment of the invention.

FIG. 9A is a schematic diagram depicting a system configured to transfer an optical pattern to a reflective electron mask 906 having a photoconductive layer 908 in accordance with an embodiment of the invention. Here, the pattern to be reflected may be formed statically or translated across (as shown in the figure) a back-illuminated "photo mask" 902. The photo mask 902 may comprise, for example, a liquid crystal display (LCD) device, or a cathode ray tube (CRT) device, or a scanned and controllably blanked optical beam. Projection optics 904 is configured to project the optical pattern onto the backside of a reflective electron mask device 906. The top side of the device 906 includes a photoconductive top layer 908. The photoconductive layer 906 may comprise, for example, a wide or direct bandgap semiconductor layer. A charging electron beam 910 may be configured to flood the photoconductive top layer 908 and thereby charge up the layer 908 with a negative potential, limited possibly by Zener breakdown. The negative charge is neutralized on the select portions of the photoconductive top layer 908 that correspond to the lighted pattern on the backside of the device 906. The charge neutralization occurs due to electron-hole pair generation and charge separation in the depletion region. Those portions with the charge neutralized no longer reflect incoming electrons such that a reflective pattern is formed. In an alternate embodiment, an electron beam may be used to form the pattern on the backside of a reflective electron mask 906.

Figure 9B:
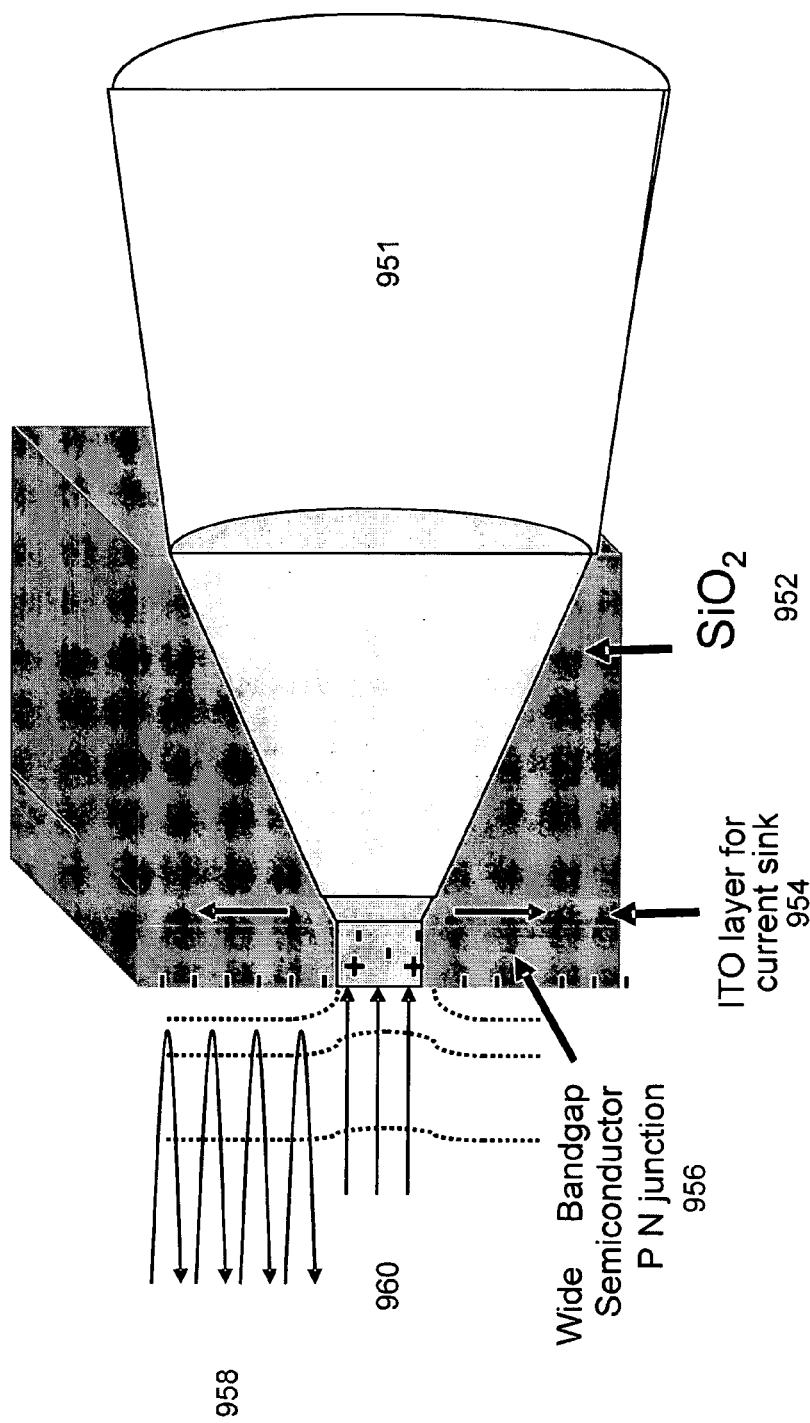
FIG. 9B is a schematic diagram with a closer view of a reflective electron mask having a photoconductive layer in accordance with an embodiment of the invention.

FIG. 9B is a schematic diagram with a closer view of a reflective electron mask (REM) 906 having a photoconductive layer in accordance with an embodiment of the invention. In this example, the REM 906 is formed with a transparent substrate 952, such as silicon dioxide. An optically transparent yet electrically conductive middle layer 954 may be included. For example, the optically transparent middle layer 954 may comprise a layer of indium tin oxide (ITO) material. The photoconductive top layer 956 may comprise a wide bandgap semiconductor forming a PN junction. The pattern of light 951 impinges upon the backside of the REM 906. Incident electrons are either reflected 958 or absorbed 960 by portions of the front side, depending on whether the corresponding backside portion receives light or not. This can be achieved by two physical mechanisms. 1) Local photoconductivity changes the films ability to sink current from any electron beam current source and thereby changes the surface voltage via Ohms law. 2) Local photovoltage which generates the carriers in the semiconductor and thereby directly bends the bands which in turn also changes the surface voltage To create a reflective electron potential that maps the illuminating pattern with good fidelity, it is best to have a photoconductor or photovoltaic surface with reduced or no lateral electrical conductivity. This prevents blurring of the surface voltage pattern by laterally diffusing charge carriers such as electrons or holes. One way to achieve such properties is to use a dense semiconductor nanowire array. These could be seeded by metal nano-catalysts particles and grown by MOCVD. These nanowire arrays are fine vertical columns 10's to 100's of nanometers in diameter and can be grown as a PN or NP diode junction for efficient photovoltage generation.

Figure 10:
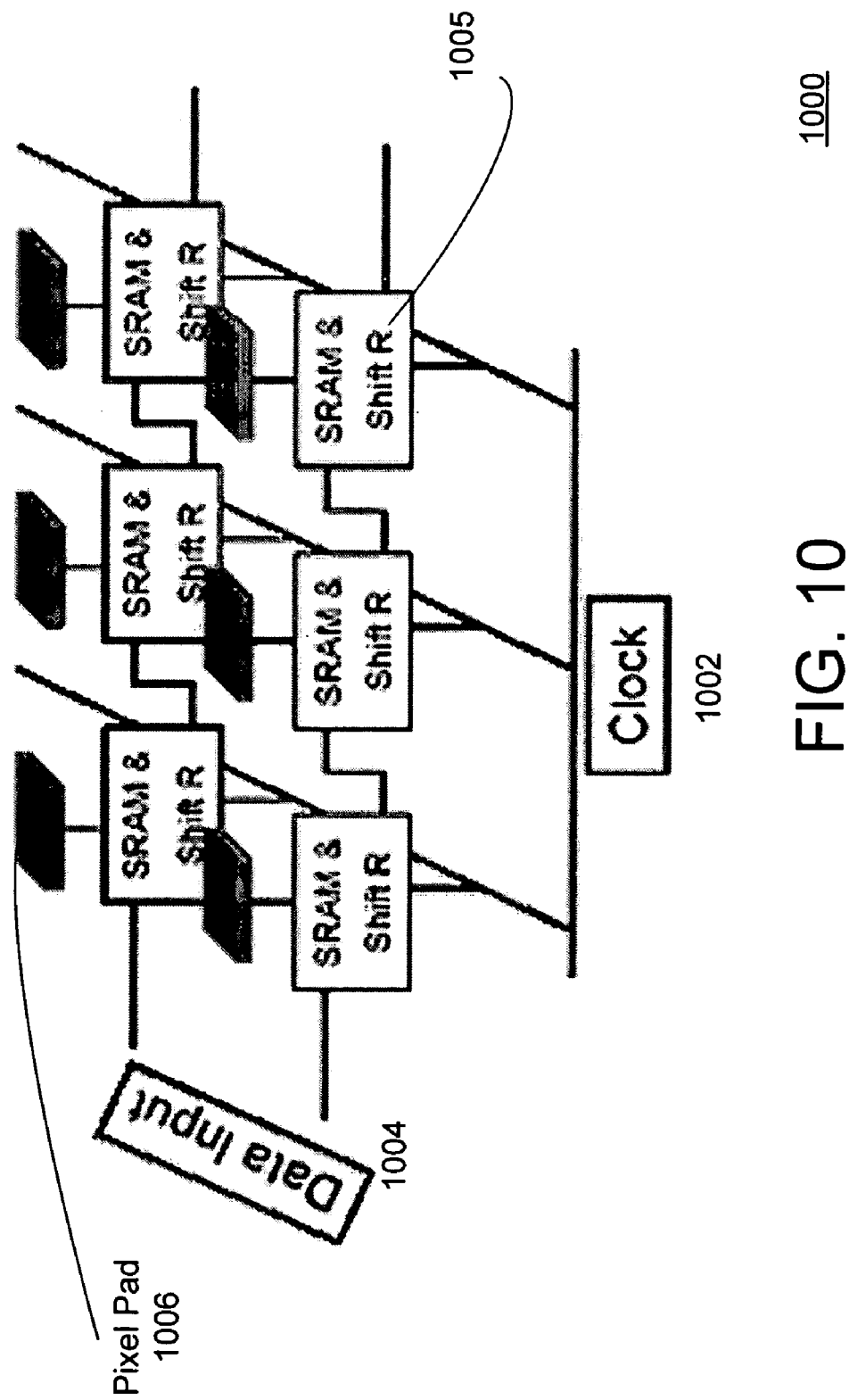
FIG. 10 is a schematic diagram of an SRAM-like structure for a reflective electron patterning device with applied-voltage-based differentiation in accordance with an embodiment of the invention.

FIG. 10 is a schematic diagram of an SRAM-like structure 1000 for a reflective electron patterning device with applied-voltage-based differentiation in accordance with an embodiment of the invention. The circuit structure 1000 comprises an array including clock signal lines 1002 and data input signal lines 1004 that couple to SRAM/shift register type cells 1005, each cell 1005 having a corresponding conductive pixel pad 1006 at the surface of the device. The circuit structure 1000 may be configured to shift one row of reflective (on) and non-reflective (off) data to a next row under control of a clock signal. In one implementation, each cell may be constructed with a pixel size of 16F×16F, where F represents the size of the design rule. Such a configuration is advantageously implemented for a lithography system operating in a "rolling" exposure mode.

FIGS. 11A through 11D are diagrams illustrating a reflective electron patterning device 1102 operated in a "rolling" mode in accordance with an embodiment of the invention. These figures depict a 10×10 pixel section of a patterning device 1102 with 4000 pixel rows and 1000 pixel columns for purposes of illustration. In this example, each pixel has dimensions of 250 nm×250 nm. In order to implement such small dimension pixels, a funnel structure may be used, such as one described below in relation to FIGS. 12 and 13. Of course, the patterning device 1102 may have different numbers of pixels and different pixel dimensions within the scope of the invention.

Figure 11A:
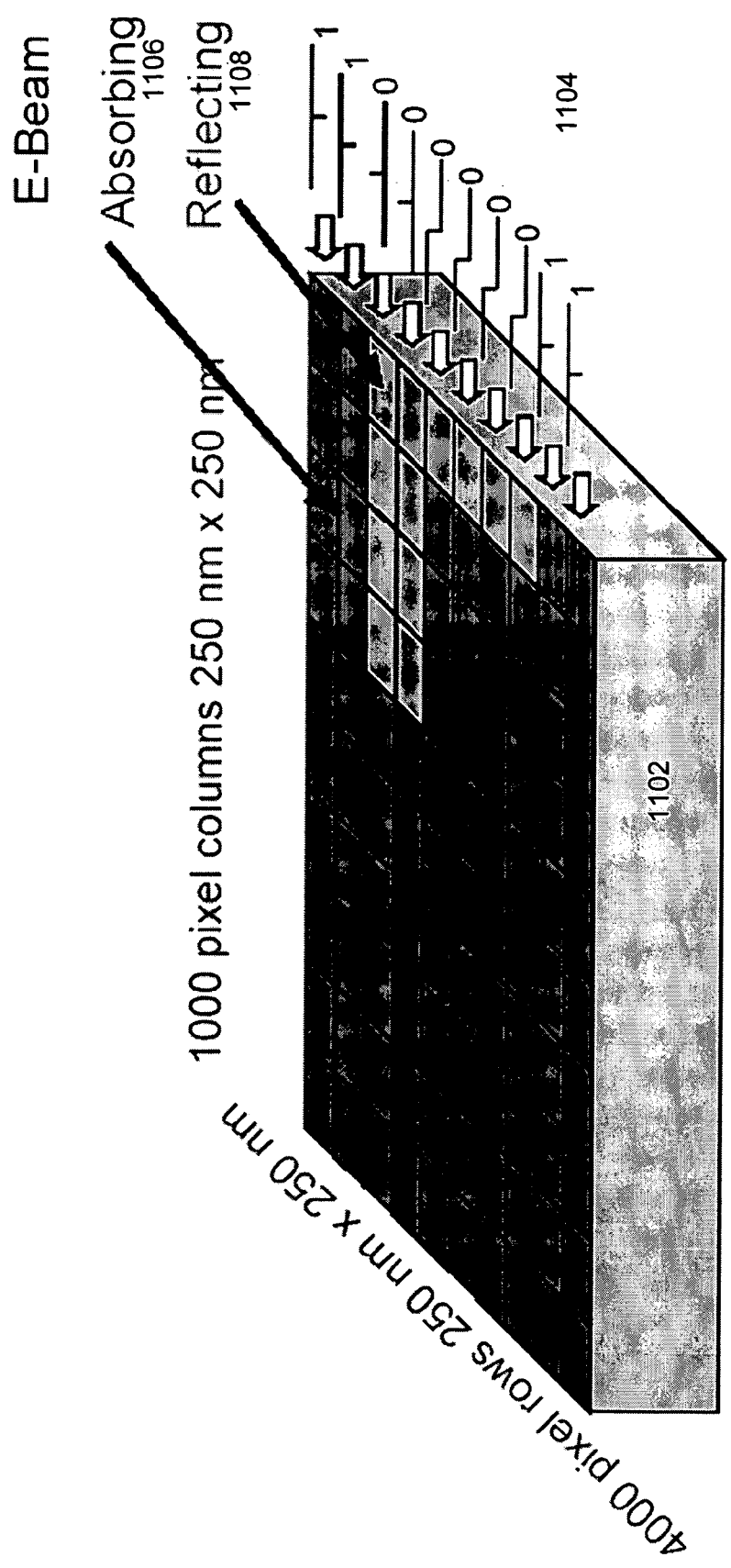
FIGS. 11A through 11D are diagrams illustrating a reflective electron patterning device operated in a "rolling" mode in accordance with an embodiment of the invention.

In FIG. 11A, a first "column" of data input signals 1104 is shown. The first column includes the binary data 1100000011. As depicted, the "1" data correspond to absorbing pixels 1106, and the "0" data correspond to reflecting pixels 1108.

Figure 11B:
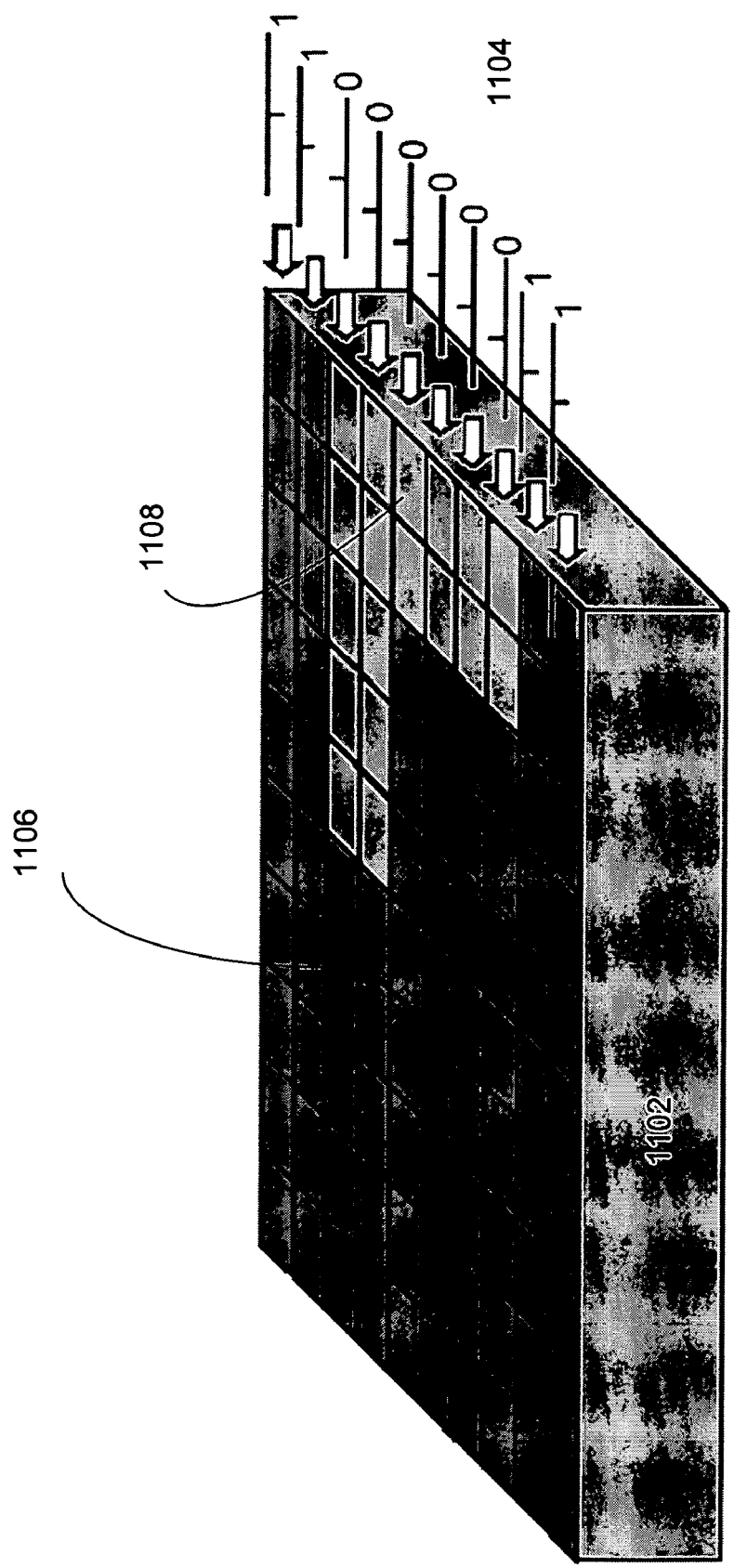

In FIG. 11B, a second "column" of data input signals 1104 is shown. The second column also includes the binary data 1100000011. Again, as depicted, the "1" data correspond to absorbing pixels 1106, and the "0" data correspond to reflecting pixels 1108. In between FIG. 11A and FIG. 11B, the data columns (and hence the corresponding pattern of on/off pixels) are shifted by one column to the left.

Figure 11C:
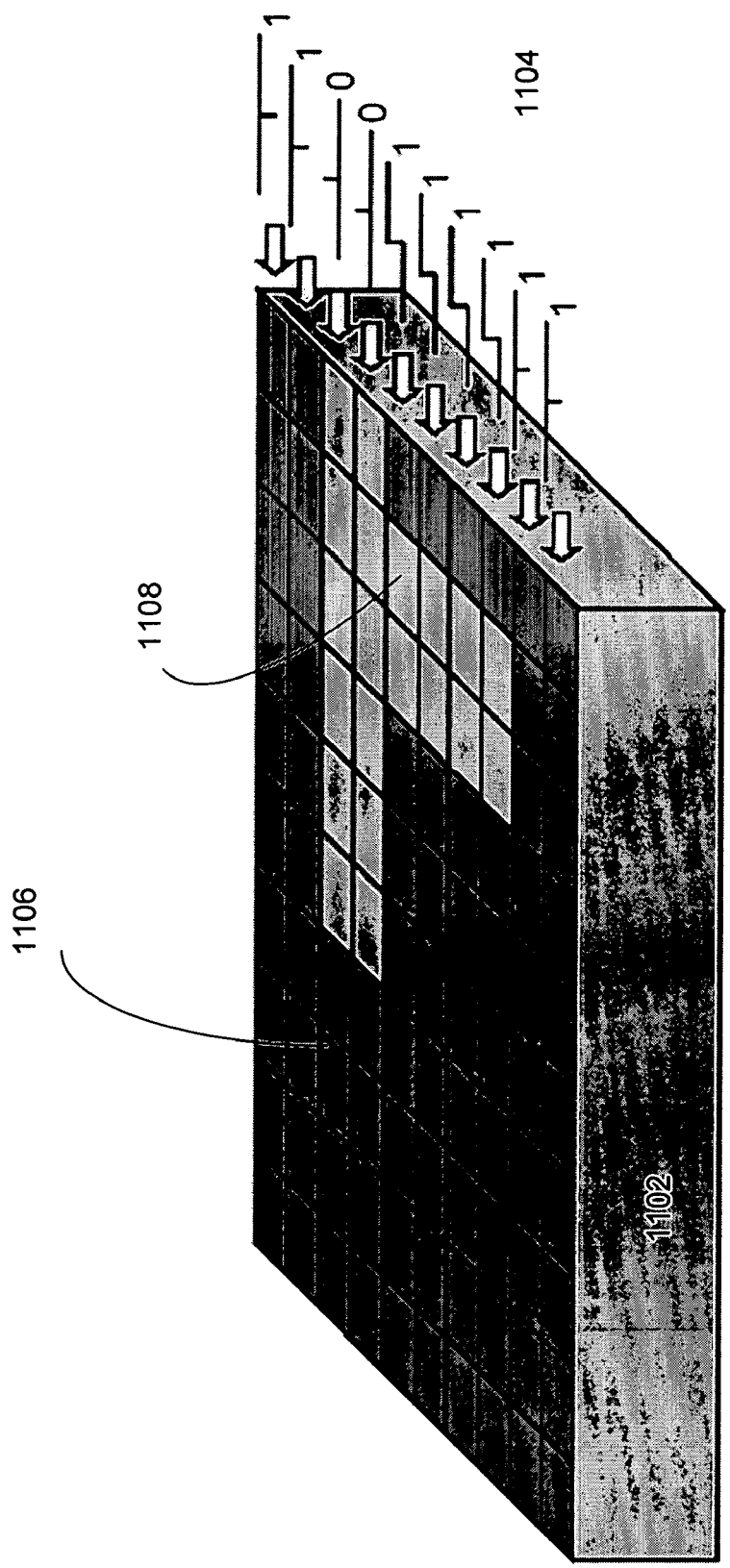

In FIG. 11C, a third "column" of data input signals 1104 is shown. The third column includes the binary data 1100111111. Again, as depicted, the "1" data correspond to absorbing pixels 1106, and the "0" data correspond to reflecting pixels 1108. In between FIG. 11B and FIG. 11C, the data columns (and hence the corresponding pattern of on/off pixels) are again shifted by one column to the left.

Figure 11D:
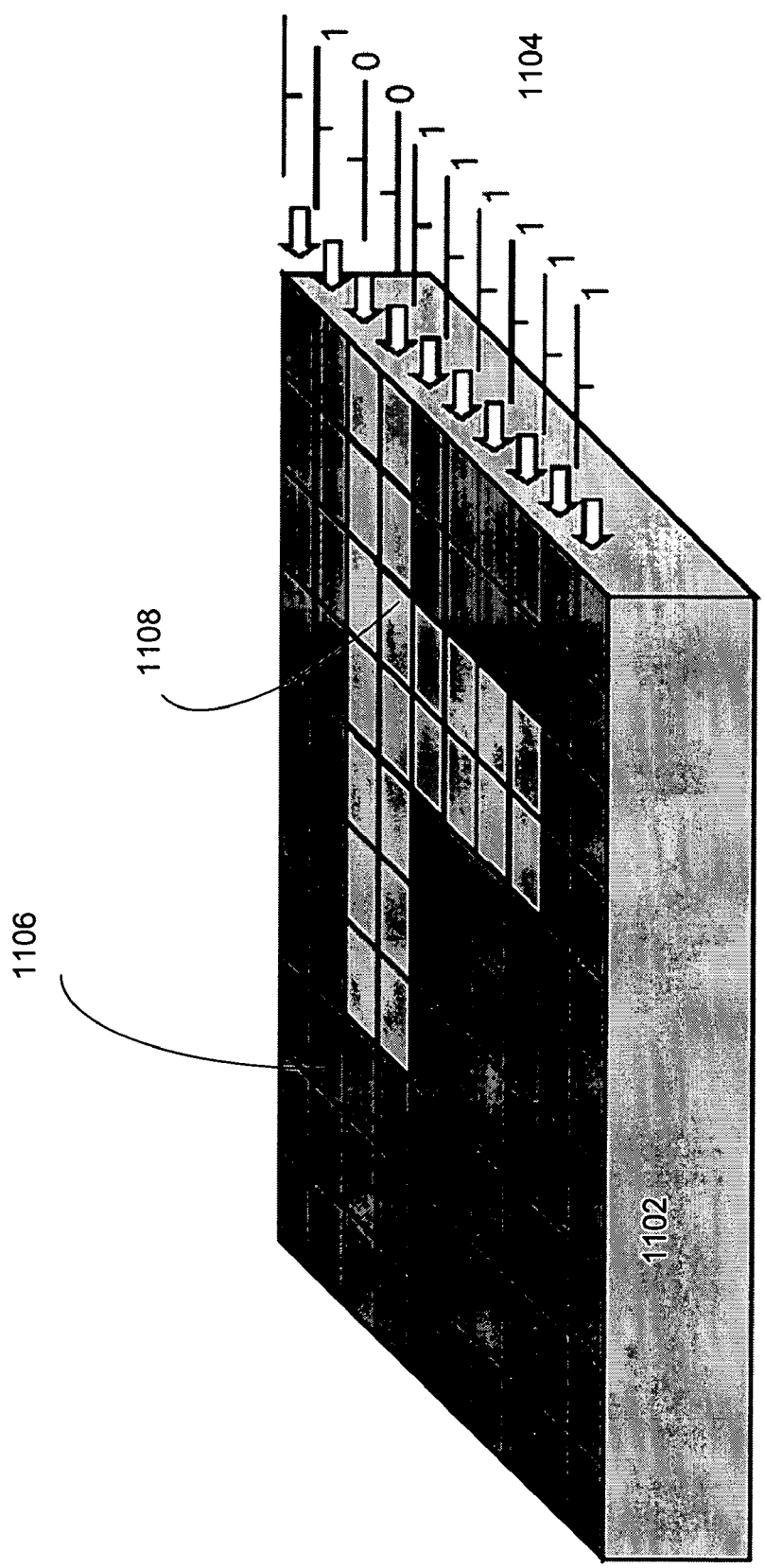

In FIG. 11D, a fourth "column" of data input signals 1104 is shown. The fourth column also includes the binary data 1100111111. Again, as depicted, the "1" data correspond to absorbing pixels 1106, and the "0" data correspond to reflecting pixels 1108. In between FIG. 11C and FIG. 11D, the data columns (and hence the corresponding pattern of on/off pixels) are again shifted by one column to the left.

FIGS. 11A through 11D illustrate a reflective electron patterning device operating in a rolling exposure mode. In the rolling exposure mode, the pattern is translated in synchronized manner with the wafer motion, either by physical translation or by electronically clocking or optically moving the pattern on the device. The relative motion is such that the image pattern on the wafer translates with the wafer much like the operation of a time-delayed integration (TDI) system. An alternate operating mode comprises a step-and-flash exposure mode.

Figure 12:
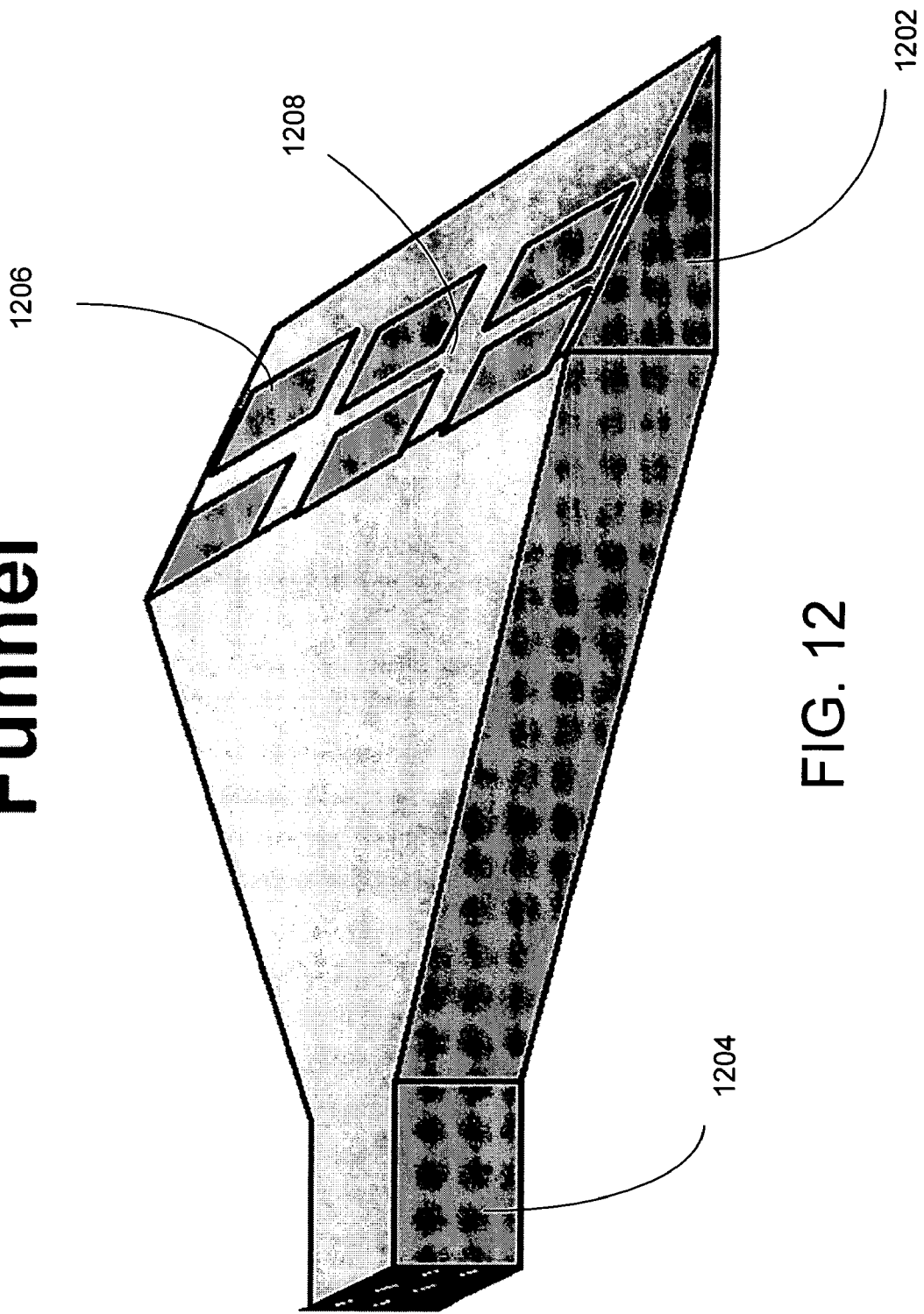
FIGS. 12 and 13 are schematic diagrams depicting a funnel-type structure for a reflective electron patterning device in accordance with an embodiment of the invention.
Figure 13:
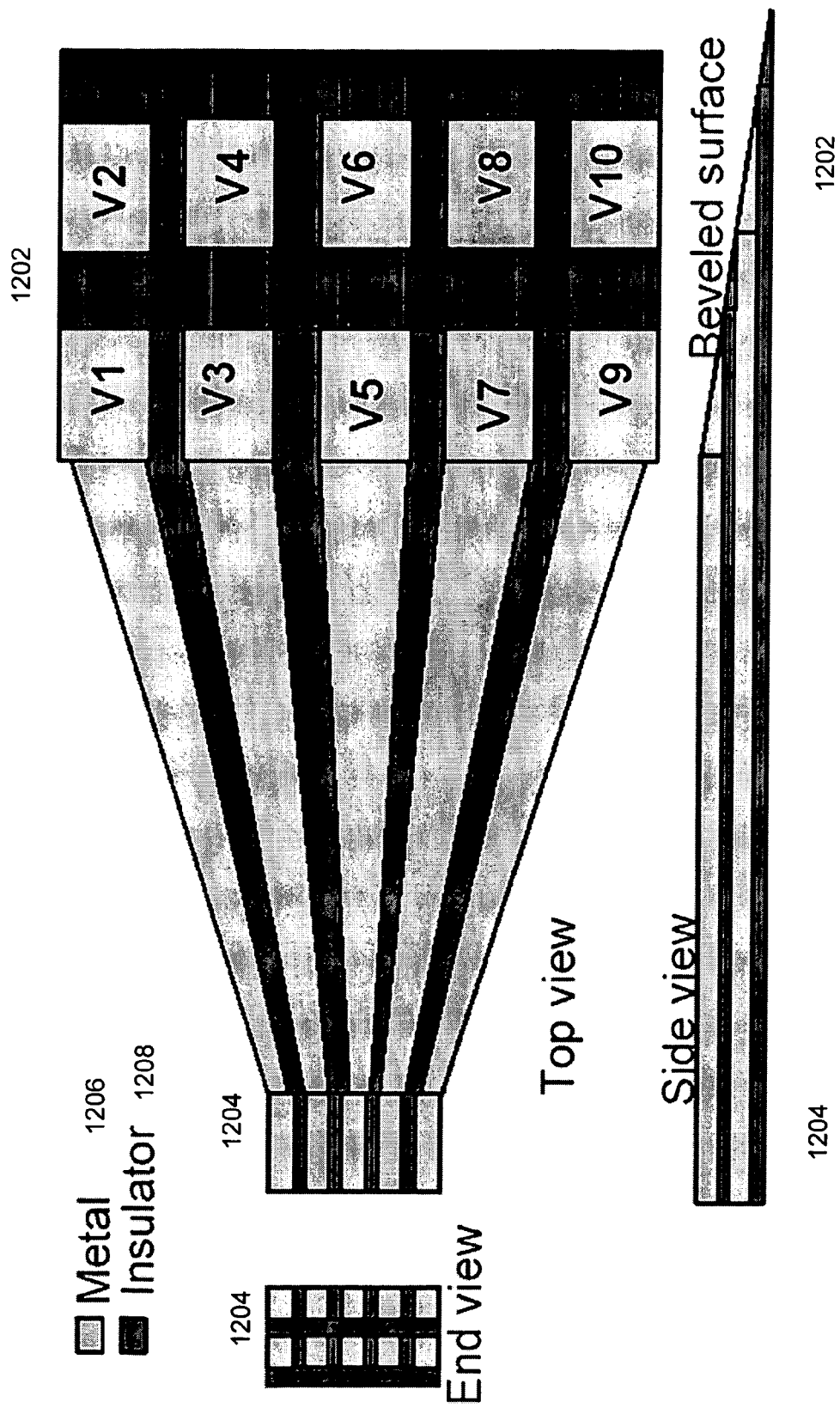

FIGS. 12 and 13 are schematic diagrams depicting a funnel-type structure for a reflective electron patterning device in accordance with an embodiment of the invention. As depicted in FIG. 12, the structure of the illustrated funnel includes an expanded side 1202 having an array of larger conductive contact pads 1206 (separated by insulator 1208) on a beveled surface and a narrower side 1204 on which the smaller pixels are configured. The contact pads 1206 make physical and electrical contact with the pixels by way of the funnel structure. In other words, electrical wiring connects each contact pad on the right to a smaller pixel on the left. The array of pixels on the left side causes reflection or absorption of electrons depending on the voltage applied to each pixel. FIG. 13 includes top, side, and end views of the example funnel structure, and shows the distinct metal 1206 and insulator 1208 portions. One embodiment of such a 3 dimensional structure can be created by a patterned array and directed pore growth using anodization as suggested in U.S. Pat. No. 6,461,528 followed by electroplating of metal thru the pores.

Figure 14:
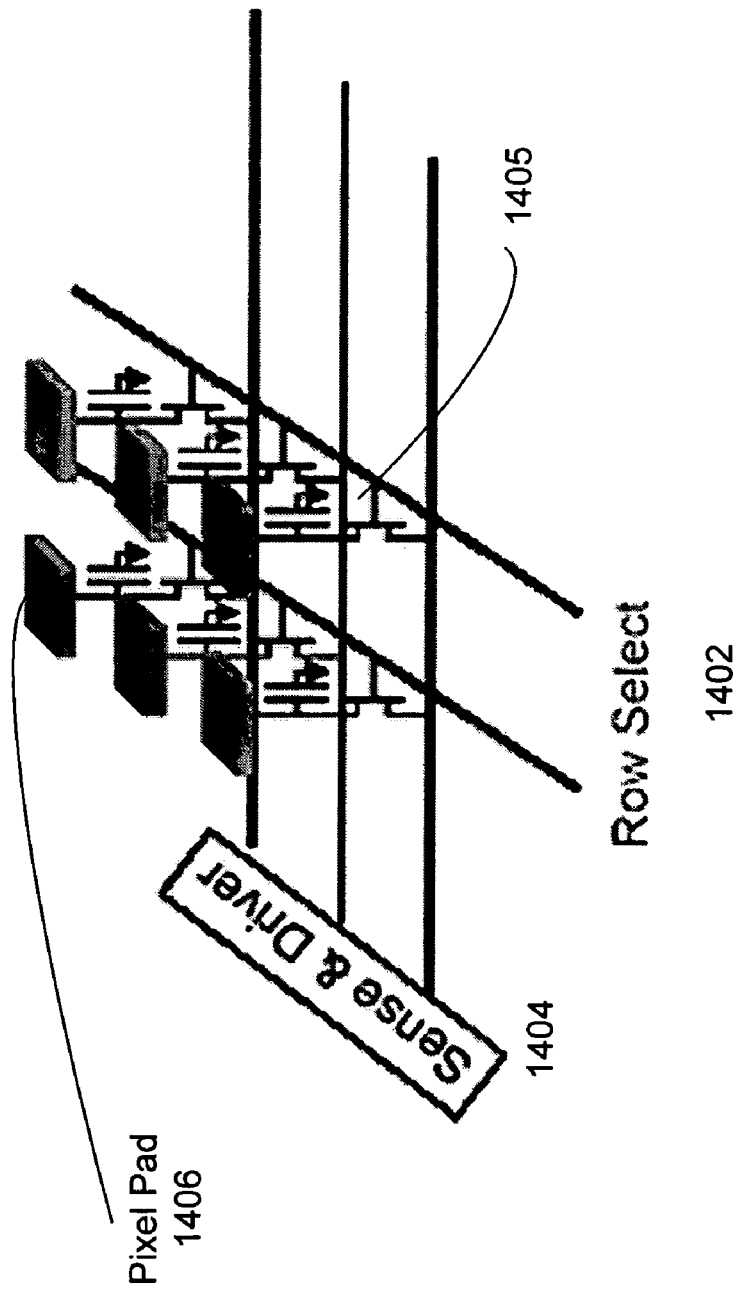
FIG. 14 is a schematic diagram of a DRAM-like structure for a reflective electron patterning device with applied voltage based differentiation in accordance with an embodiment of the invention.

FIG. 14 is a schematic diagram of a DRAM-like structure for a reflective electron patterning device with applied voltage based differentiation in accordance with an embodiment of the invention. The circuit structure 1400 comprises an array including row select lines 1402 and sense and driver signal lines 1404 that couple to DRAM-like cells 1405, each cell 1405 having a corresponding conductive pixel pad 1406 at the surface of the device. As a result, these pixels 1406 may be configured as advantageously smaller. Each cell may be constructed with as few as one transistor and one capacitor. For example, under 55-nm design rules (F=55 nm), each pixel may be 4F×4F or 225 nm×225 nm. Smaller pixels advantageously relax the demagnification requirements on the projection optics (for example, to a more comfortable 10×). The circuit structure 1400 may be configured to operate in a step-and-flash exposure mode. Step-and-flash operation may be implemented using additional deflection coils or electrostatic deflectors to move the image pattern generated in synchronized manner with the wafer, and to stitch together adjacent frames if necessary. Unlike the rolling exposure operation, the step-and-flash exposure operation does not provide pixel redundancy; each pixel should work in order to create the correct pattern.

Figure 15:
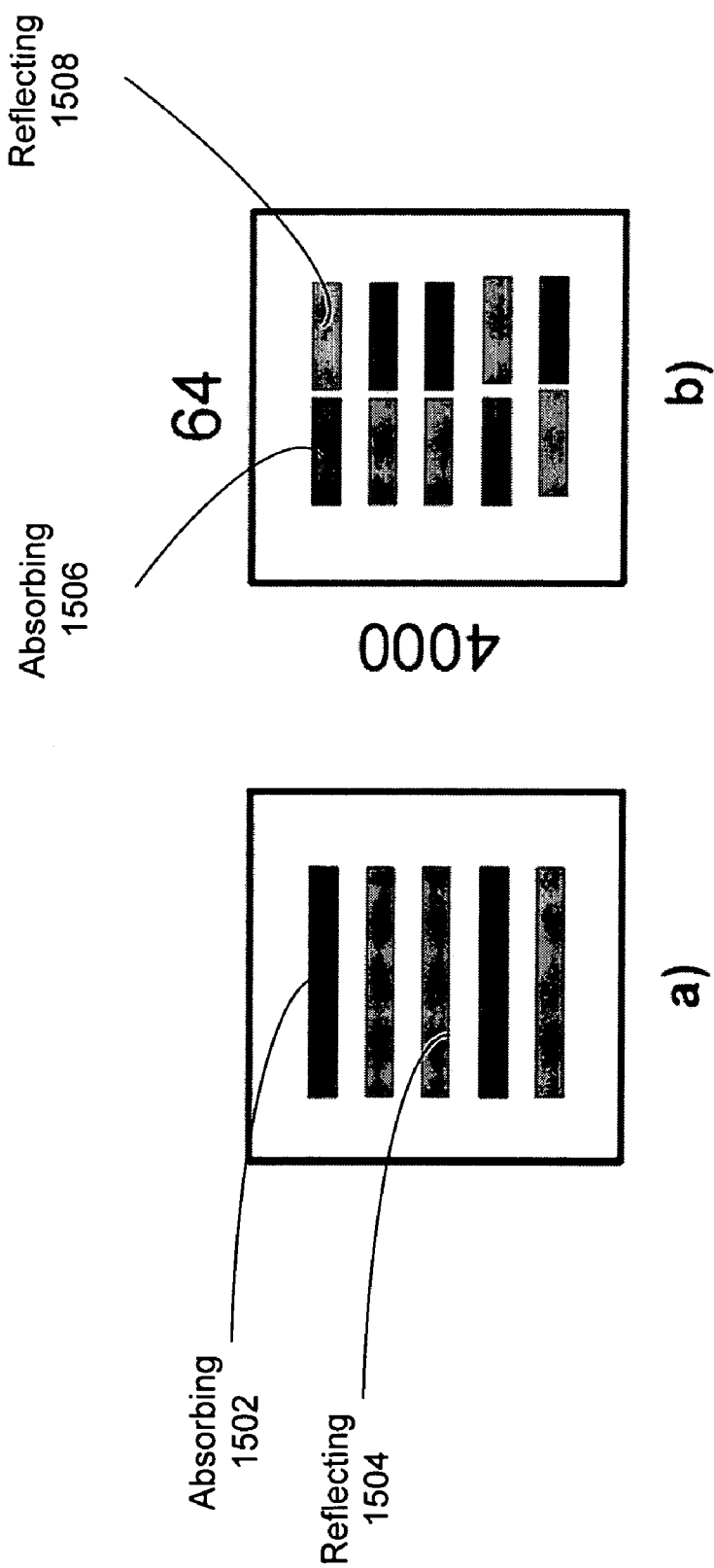
FIG. 15 is a diagram illustrating a) a reflective electron patterning device configured as a one-dimensional array and b) a reflective electron patterning device configured as a two-dimensional array of elongated pixels in accordance with embodiments of the invention.

FIG. 15 is a diagram illustrating a) a reflective electron patterning device configured as a one-dimensional array and b) a reflective electron patterning device configured as a two-dimensional array of elongated pixels in accordance with embodiments of the invention.

Per FIG. 15a, the reflective electron patterning device configured as a one-dimensional array comprises an electronic circuit with a single row of elongated pixels, each pixel may be absorbing 1502 or reflecting 1504 depending on an applied voltage. For example, the row may have 4000 elongated pixels, and each pixel may measure 200 nm wide and 200 microns long (1000 times longer than wide). In an example implementation, the projection optics may be configured with a quadrupole (or similarly functional) lens which demagnifies the image of each pixel by a factor of M=9 in the shorter dimension and a factor of 1000 M=9000 in the elongated dimension to expose a 22.5 nm×22.5 nm pixel on the wafer. Such a patterning device would "print" one row of four thousand 22.5 nm×22.5 nm pixels, then change the state of the pixels and print another row, and so on. Advantageously, this approach may remove complexity, reduce cost, and increase reliability of the patterning device. Electron-electron interactions are advantageously reduced by increasing the area above each pixel on the patterning device. Despite having fewer pixels than the 4000×1000 pixel patterning device, the same throughput is achievable because each pixel may reflect 1000 times as many electrons.

Per FIG. 15b, the reflective electron patterning device may be configured as a two-dimensional array of elongated pixels, each elongated pixel may be absorbing 1502 or reflecting 1504 depending on an applied voltage. For example, the circuit may contain an array of 4000×64 elongated pixels, each pixel measuring 200 nm wide and 3.2 microns long (16 times longer than wide). Using this patterning device, the pattern may be scrolled across the device in the manner depicted in FIGS. 11A through 11D and described in relation thereto. Advantageously, the demagnification requirements are reduced. In accordance with the specific example cited above, the demagnification may be by a factor of 8 in the shorter dimension and a factor of 128 in the elongated dimension.

In addition to the binary absorptive/reflective reflective mask operation discussed above, phase contrast may be used to either write the features directly, or to enhance contrast at higher spatial frequencies. Such phase effects result from potential differences or other variations between two adjacent pixels that are both reflective. In other words, an electron wave function may have two different phase shifts on reflection that can cause constructive or destructive interference patterns on the imaged pattern. The short coherence length of an electron source will make such interference effects very local. These phase effects may be used to advantage to either create patterns or to optimize edge definition of the desired patterns.

The above-described diagrams are not necessarily to scale and are intended be illustrative and not limiting to a particular implementation. In the above description, numerous specific details are given to provide a thorough understanding of embodiments of the invention. However, the above description of illustrated embodiments of the invention is not intended to be exhaustive or to limit the invention to the precise forms disclosed. One skilled in the relevant art will recognize that the invention can be practiced without one or more of the specific details, or with other methods, components, etc. In other instances, well-known structures or operations are not shown or described in detail to avoid obscuring aspects of the invention. While specific embodiments of, and examples for, the invention are described herein for illustrative purposes, various equivalent modifications are possible within the scope of the invention, as those skilled in the relevant art will recognize.

These modifications can be made to the invention in light of the above detailed description. The terms used in the following claims should not be construed to limit the invention to the specific embodiments disclosed in the specification and the claims. Rather, the scope of the invention is to be determined by the following claims, which are to be construed in accordance with established doctrines of claim interpretation.

What is claimed is:

1. A reflective electron patterning device, the device comprising:
    a pattern on a top surface;
    an electron reflective portion of the pattern;
    an electron non-reflective portion of the pattern; and
    an array of circuitry for dynamically varying the electron reflective and non-reflective portions of the pattern using independently-controllable pixels and for operating in a rolling exposure mode by shifting one row of said pixels to a next row under control of a clock signal so as to translate the pattern in a synchronized manner with a motion of a target substrate.

2. The device of claim 1, wherein the reflective portion is configured to mirror a greater fraction of incident electrons than the non-reflective portion.

3. The device of claim 1, wherein the top surface comprises a photoconductive material.

4. The device of claim 3, wherein the pattern on the surface is formed by way of a pattern of incident light on a reverse surface of the device.

5. The device of claim 4, wherein the photoconductive material of the top surface comprises a wide bandgap semiconductor such that the incident light creates electron-hole pairs to neutralize surface charge at the non-reflective portion of the pattern.

6. The device of claim 5, wherein the reverse surface comprises a transparent substrate, and further comprising an electrically conductive and optically transparent layer in between the wide bandgap semiconductor and the top surface.

7. The device of claim 6, wherein the insulator comprises silicon dioxide, and wherein the electrically conductive and optically transparent layer comprises Indium Tin Oxide.

8. The device of claim 6, wherein the semiconductor is doped to form a PN junction so that a photovoltage can be induced.

9. The device of claim 8, wherein the device has the form of a dense vertically oriented array of semiconductor nanowires so as to limit lateral diffusion of charge and give photovoltage fidelity.

10. The device of claim 1, further comprising insulator material configured to separate conductive material into said pixels, and wherein a relatively negative voltage is applied to reflective pixels, and a relatively positive voltage is applied to the non-reflective pixels.

11. The device of claim 10, wherein the applied voltages are programmable.

12. The device of claim 1, wherein the device operates in a rolling mode so as to track a relative movement of a semiconductor wafer being lithographically patterned.

13. The device of claim 1, wherein the device comprises a funnel structure having a narrow portion at said surface and a wide portion having an array of large contact pads conductively coupled to the conductive material of the reflective and non-reflective portions.

14. The device of claim 13, wherein the wide portion comprises a beveled surface.

15. The device of claim 11, wherein the device comprises an array of cells, each cell comprising a capacitor and at least one transistor.

16. The device of claim 15, wherein charge stored on the capacitor determines whether a cell is reflective or non-reflective.

17. The device of claim 11, wherein the device comprises a one dimensional array of elongated cells.

18. The device of claim 11, wherein the device comprises a two-dimensional array of elongated cells.

19. A method of reflecting a pattern of electrons, the method comprising:
    generating an electron beam incident upon a surface;
    forming the pattern on the surface using an array of circuitry for dynamically controlling reflective and non-reflective portions of the pattern using independently-controllable pixels and for shifting one row of said pixels to a next row under control of a clock signal so as to translate the pattern in a synchronized manner with a motion of a target substrate;
    reflecting the incident electrons from a reflective portion of the pattern; and
    preventing the incident electrons from being reflected from a non-reflective portion of the pattern.

20. The method of claim 19, wherein the reflective portion is configured to mirror a greater fraction of incident electrons than the non-reflective portion.

21. The method of claim 19, wherein the surface comprises a photoconductive material.

22. The method of claim 21, wherein the pattern on the surface is formed by way of a pattern of incident light on a reverse surface.

23. The method of claim 22, wherein the photoconductive material of the surface comprises a wide bandgap semiconductor such that the incident light creates electron-hole pairs to neutralize surface charge at the non-reflective portion of the pattern.

24. The method of claim 23, wherein the reverse surface comprises an insulator, and wherein an electrically conductive and optically transparent layer is provided in between the wide bandgap semiconductor and the insulator.

25. The method of claim 24, wherein the insulator comprises silicon dioxide, and wherein the electrically conductive and optically transparent layer comprises Indium Tin Oxide.

26. The method of claim 24, wherein the semiconductor is doped to form a PN junction so that a photovoltage can be induced.

27. The method of claim 24, wherein lateral diffusion of charge is limited by way of a dense vertically oriented array of semiconductor nanowires.

28. The method of claim 19, further comprising insulator material configured to separate conductive material of the reflective and non-reflective portions, and wherein a relatively negative voltage is applied to the reflective portion, and a relatively positive voltage is applied to the non-reflective portion.

29. The method of claim 28, wherein the applied voltages are programmable.

30. The method of claim 28, wherein the method operates in a rolling mode so as to track a relative movement of a semiconductor wafer being lithographically patterned.

31. The method of claim 19, wherein the voltages are applied using a funnel structure having a narrow portion at said surface and a wide portion having an array of large contact pads conductively coupled to the conductive material of the reflective and non-reflective portions, and wherein directed pore growth and electroplating is used to form the funnel structure.

32. The method of claim 31, wherein the wide portion comprises a beveled surface.

33. The method of claim 29, wherein the pattern is formed using an array of cells, each cell comprising a capacitor and at least one transistor.

34. The method of claim 33, wherein charge stored on the capacitor determines whether a cell is reflective or non-reflective.

35. The method of claim 29, wherein the pattern is formed using a one dimensional array of elongated cells.

36. The method of claim 29, wherein the pattern is formed using a two-dimensional array of elongated cells.

37. An apparatus for reflecting a pattern of electrons, the method comprising:

means for generating an electron beam incident upon a surface;

means for forming the pattern on the surface;

means for reflecting the incident electrons from a reflective portion of the pattern;

means for preventing the incident electrons from being reflected from a non-reflective portion of the pattern; and means for dynamically varying the reflective and non-reflective portions of the pattern using independently-controllable pixels and for shifting one row of said pixels to a next row under control of a clock signal so as to translate the pattern in a synchronized manner with a motion of a target substrate.

38. The device of claim 13, wherein the funnel structure is made by directed pore growth and electroplating.

* * * * *